(12) United States Patent
Jarvis

(10) Patent No.: US 9,788,443 B2
(45) Date of Patent: *Oct. 10, 2017

(54) SYSTEMS AND METHODS FOR COUPLING ELECTRICALLY ISOLATED SECTIONS OF AN ELECTRONIC DEVICE

(71) Applicant: Apple Inc., Cupertino, CA (US)

(72) Inventor: Daniel William Jarvis, Cupertino, CA (US)

(73) Assignee: APPLE INC., Cupertino, CA (US)

( * ) Notice: Subject to any disclaimer, the term of this patent is extended or adjusted under 35 U.S.C. 154(b) by 14 days.

This patent is subject to a terminal disclaimer.

(21) Appl. No.: 14/810,501

(22) Filed: Jul. 28, 2015

(65) Prior Publication Data

US 2015/0334860 A1    Nov. 19, 2015

Related U.S. Application Data

(63) Continuation of application No. 13/251,039, filed on Sep. 30, 2011, now Pat. No. 9,098,237.
(Continued)

(51) Int. Cl.
*H05K 5/02*   (2006.01)
*H05K 5/00*   (2006.01)
(Continued)

(52) U.S. Cl.
CPC ......... *H05K 5/0247* (2013.01); *G06F 1/1626* (2013.01); *H04M 1/0249* (2013.01); *H05K 5/0004* (2013.01); *H05K 5/0217* (2013.01)

(58) Field of Classification Search
CPC .... H05K 5/006; H05K 5/0069; H05K 5/0217; H05K 5/0286; H05K 5/0291; H05K 5/0004; H04M 1/0249
(Continued)

(56) References Cited

U.S. PATENT DOCUMENTS 7,682,727 B2 *  3/2010  Hsu ..................... H01M 2/1066
                                                      292/137
8,322,801 B2 * 12/2012  Yang .................... F16B 5/0642
                                                      312/222
(Continued)

FOREIGN PATENT DOCUMENTS

CN   102076189   5/2011
TW   201127595   8/2011

*Primary Examiner* — David M Sinclair
*Assistant Examiner* — Robert Brown
(74) *Attorney, Agent, or Firm* — Brownstein Hyatt Farber Schreck, LLP

(57) ABSTRACT

Each knuckle is molded in and/or around a coupling structure that is either welded to or is an integral part of the section. The coupling structure can be a bracket that is welded to an inner surface of a section, and the bracket is constructed to have a cross-section that minimizes capacitance. In one embodiment, a first bracket can be welded to a first conductive section, and a second bracket can be welded to a second conductive section. A knuckle constructed from an insulating material that is overmolded within and around the first and second brackets such that the first and second conductive sections are coupled together. The first and second conductive sections and their respective brackets are spaced a predetermined distanced apart, thereby ensuring the conductive sections are electrically isolated.

21 Claims, 12 Drawing Sheets

Related U.S. Application Data

(60) Provisional application No. 61/529,710, filed on Aug. 31, 2011.

(51) Int. Cl.
  *G06F 1/16* (2006.01)
  *H04M 1/02* (2006.01)

(58) Field of Classification Search
  USPC .................................................... 361/801
  See application file for complete search history.

(56) References Cited

U.S. PATENT DOCUMENTS

| | | | | |
|---|---|---|---|---|
| 8,482,911 B2* | 7/2013 | Kuo | ............... | G06F 1/1656 312/223.2 |
| 8,587,939 B2* | 11/2013 | McClure | ............... | G06F 1/1626 312/223.1 |
| 2009/0323292 A1* | 12/2009 | Hwang | ............... | G06F 1/1615 361/730 |
| 2010/0091439 A1* | 4/2010 | Horii | ............... | H04M 1/0249 361/679.01 |
| 2010/0124033 A1* | 5/2010 | Katagiri | ............... | H05K 3/301 361/756 |
| 2010/0214038 A1* | 8/2010 | Kurita | ............... | H01G 9/012 333/185 |
| 2011/0188178 A1* | 8/2011 | Myers | ............... | G06F 1/1626 361/679.01 |
| 2011/0292626 A1* | 12/2011 | Kawai | ............... | H01G 9/012 361/782 |
| 2013/0307736 A1* | 11/2013 | Larsen | ............... | H01Q 1/243 343/702 |
| 2014/0311767 A1* | 10/2014 | Merz | ............... | G06F 1/1656 174/50 |
| 2016/0044816 A1* | 2/2016 | Jarvis | ............... | H01R 43/205 361/759 |

* cited by examiner

SYSTEMS AND METHODS FOR COUPLING ELECTRICALLY ISOLATED SECTIONS OF AN ELECTRONIC DEVICE

CROSS-REFERENCE TO RELATED APPLICATIONS

This application is a continuation patent application of U.S. patent application Ser. No. 13/251,039, filed Sep. 30, 2011 and titled "Systems and Methods for Coupling Electrically Isolated Sections of an Electronic Device," which claims the benefit of U.S. provisional patent application No. 61/529,710, filed Aug. 31, 2011 and titled "Systems and Methods for Coupling Electrically Isolated Sections of an Electronic Device," the disclosures of which are hereby incorporated by reference herein in their entireties.

FIELD OF THE INVENTION

Systems and methods are disclosed for coupling sections of an electronic device. In particular, components of an electronic device can be assembled from two or more sections, where these sections may be coupled together using knuckles.

BACKGROUND OF THE DISCLOSURE

A portable electronic device can be constructed using different approaches. In some cases, an electronic device can be constructed by assembling several components together. These "components" can include external components that are combined to form a device enclosure (e.g., a device "housing"), as well as internal components that may provide structural support or other functionality for the electronic device (e.g., the internal component could be a microchip). Based on the design of the electronic device, the components can be formed from any suitable material(s) such as metals, plastics, or any other materials.

In some cases, the various components of the electronic device can operate as part of an electrical circuit. For example, a particular component could serve as a resistor or as a capacitor to another part of the electronic device. As another example, a component can function as part of an antenna assembly of the electronic device. If the component is used in only a single electrical circuit, then the component may be constructed from a single piece of conductive material. If the same component, however, is used in several different electrical circuits, the component may need to be constructed from several "sections" of conductive elements. In this case, however, it may be necessary to separate each of the conductive sections with an insulating or other non-conductive material, in order to ensure that each section operates in its own electrical circuit correctly.

SUMMARY OF THE DISCLOSURE

This is directed to systems and methods for coupling sections of an electronic device. In some embodiments, an electronic device can be formed from several components, such as an outer periphery component and/or other components. The outer periphery component may provide a housing structure for the electronic device by encircling the electronic device. In some cases, this outer periphery component can be assembled from two or more "sections." Knuckles may then be used to couple these sections together.

Each knuckle is molded in and/or around a coupling structure that is either welded to or is an integral part of the section. The coupling structure can be a bracket that is welded to an inner surface of a section, and the bracket can be constructed to have a cross-section that minimizes capacitance. In one embodiment, a first bracket can be welded to a first conductive section, and a second bracket can be welded to a second conductive section. A knuckle constructed from an insulating material that is overmolded within and around the first and second brackets such that the first and second conductive sections are coupled together. The first and second conductive sections and their respective brackets are spaced a predetermined distanced apart, thereby ensuring the conductive sections are electrically isolated. In another embodiment, a knuckle can physically couple two conductive sections together by interfacing with a bracket of a first conductive section and by interfacing with an integral coupling structure of a second conductive section.

BRIEF DESCRIPTION OF THE DRAWINGS

The above and other features of the present invention, its nature and various advantages will be more apparent upon consideration of the following detailed description, taken in conjunction with the accompanying drawings in which.

DETAILED DESCRIPTION OF THE DISCLOSURE

An electronic device can include several components assembled together to form internal and/or external features of the electronic device. For example, one or more internal components (e.g., electrical circuitry and/or internal support structures) can be placed within external components (e.g., housing structures) to provide an electronic device having desired functionality. As used herein, the term "component" refers to a distinct entity of an electronic device, such as a particular electronic circuit (e.g., a microchip), a member forming the housing of the electronic device (e.g., a back-plate, an outer periphery component, and the like), an internal support structure (e.g., a mid-plate), and the like.

In some cases, a component can be manufactured by assembling and connecting two or more different individual elements (i.e., "sections") together. As used herein, the term "section" refers to an individual portion of a component, where that component may be formed from multiple sections. The various sections of the component may then be coupled together using a "knuckle." Based on the desired functionality and design of the component and its sections, these knuckles can exhibit a wide range of shapes and structures. For example, the knuckles can include structural designs that reinforce the knuckle at areas of high mechanical strain, that counteract twisting movements at areas of high torsion, that interlock two sections together such that they are mechanically coupled together, that provide electrical isolation between the sections, and the like.

Figure 1:
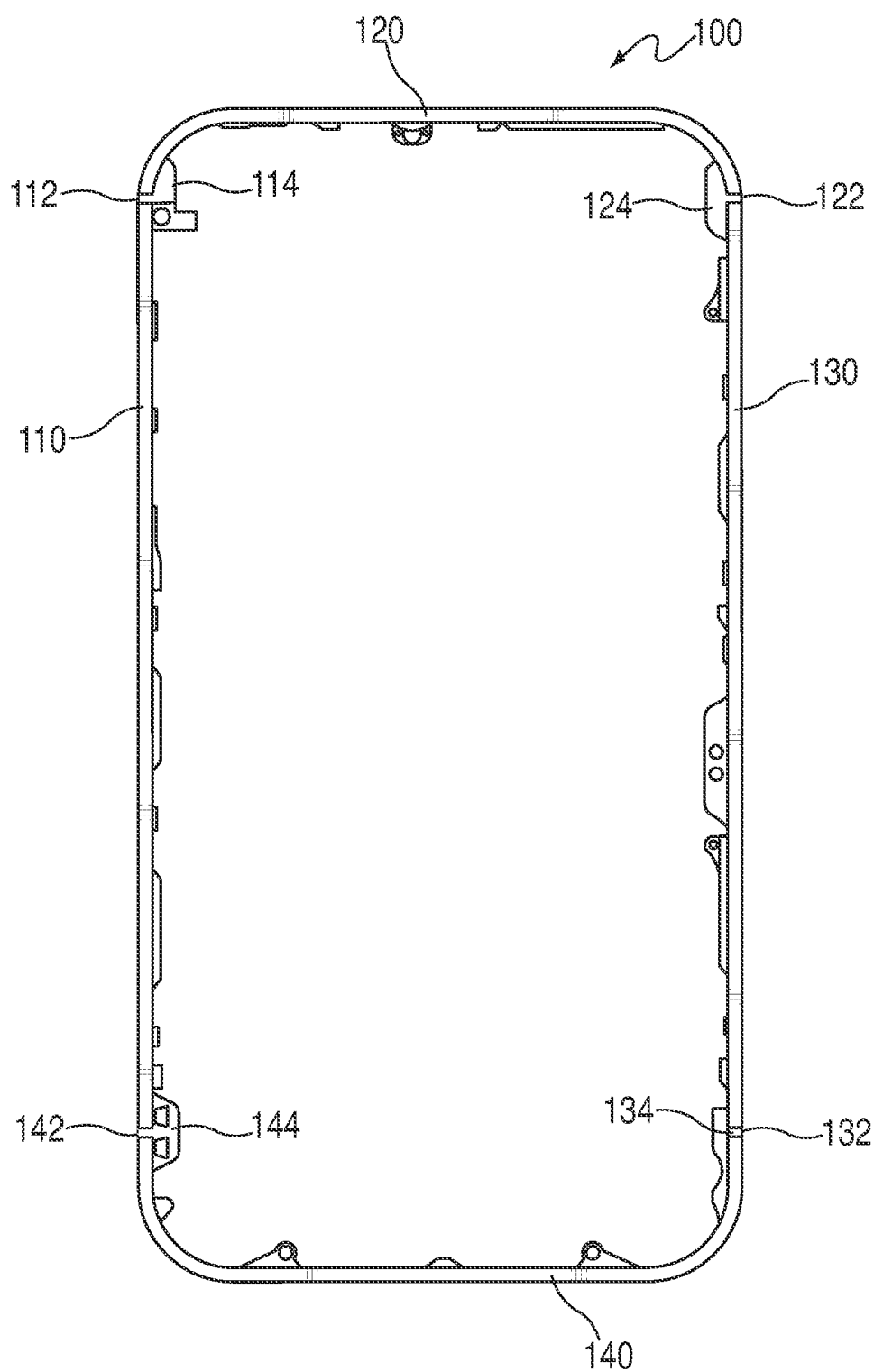
FIG. 1 shows a schematic view of an illustrative component of an electronic device in accordance with some embodiments of the present invention.
Figure 2A:
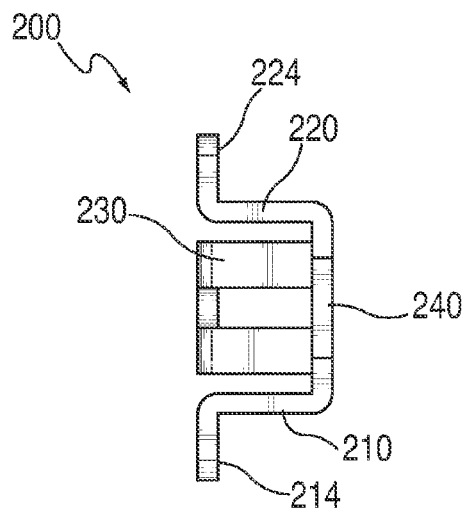
FIGS. 2A-G show several views of an illustrative bracket in accordance with some embodiments of the invention.
Figure 2B:
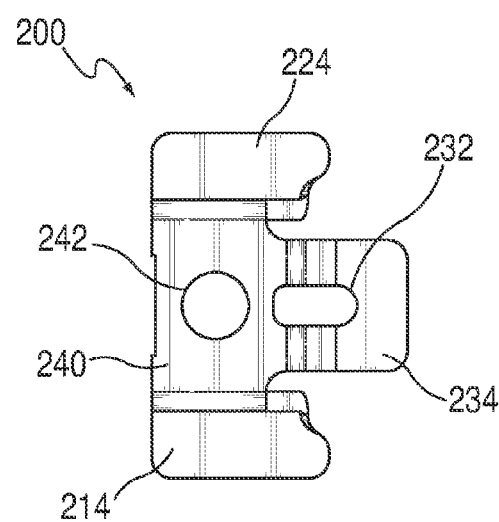
Figure 2C:
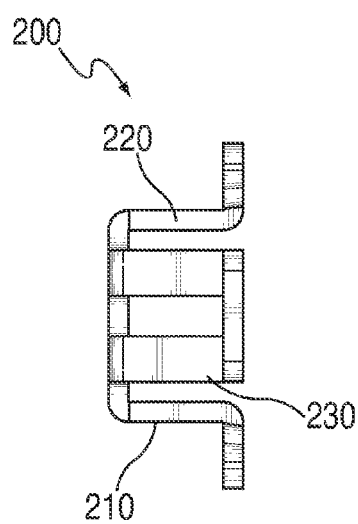
Figure 2D:
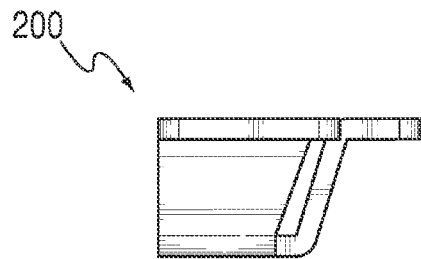
Figure 2E:
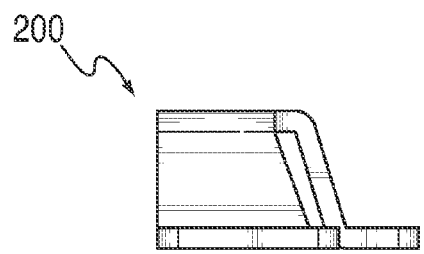
Figure 2F:
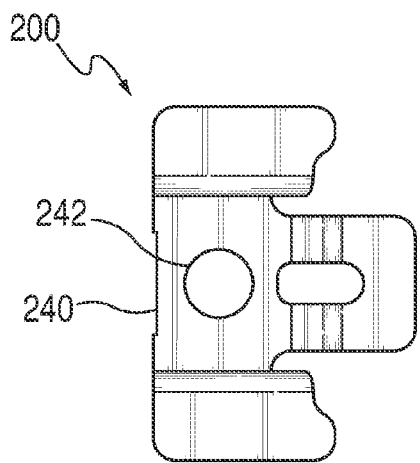
Figure 2G:
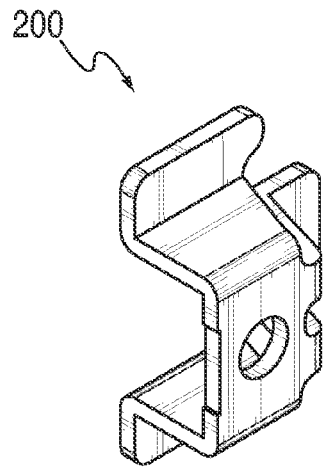
Figure 2H:
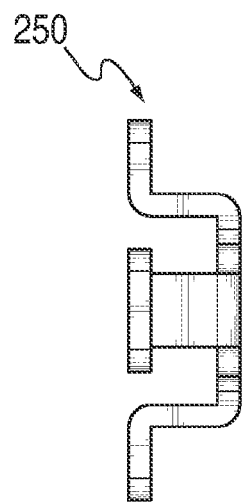
FIGS. 2H-2N show several views of another illustrative bracket in accordance with some embodiments of the invention.
Figure 2I:
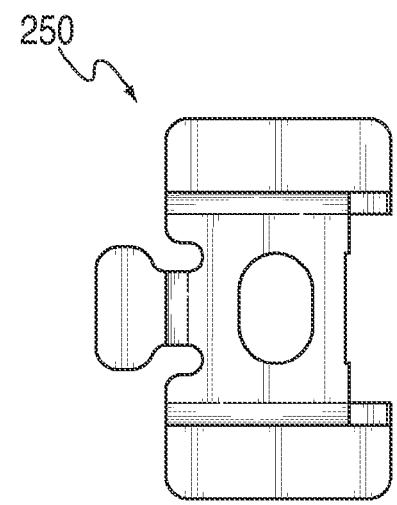
Figure 2J:
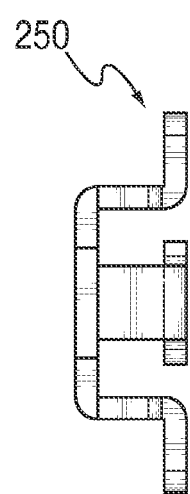
Figure 2K:
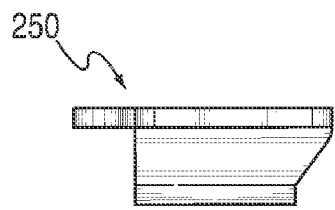
Figure 2L:
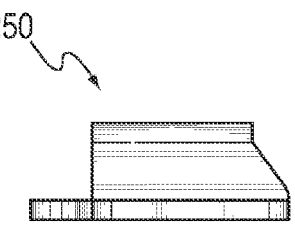
Figure 2M:
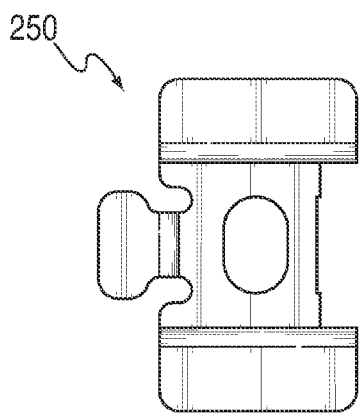
Figure 2N:
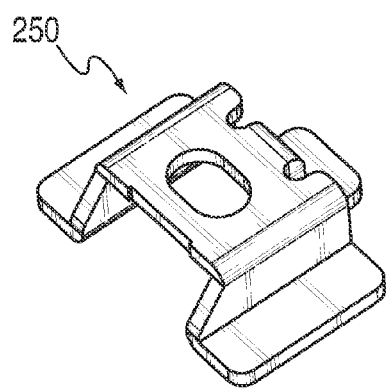

FIG. 1 shows a schematic view of an illustrative component of an electronic device in accordance with some embodiments of the present invention. In particular, FIG. 1 shows outer periphery component 100 that can be constructed by connecting several sections together, such as sections 110, 120, 130, and 140. Outer periphery component 100 can be constructed to form an exterior, periphery surface for an electronic device. In particular, outer periphery component 100 can surround or wrap around some or all of the internal components (e.g., electronic circuits, internal support structures, and the like) of the electronic device. In other words, outer periphery component 100 can define an internal volume into which internal components can be placed.

The thickness, length, height, and cross-section of outer periphery component 100 can be selected based on any suitable criteria including, for example, based on structural requirements (e.g., stiffness or resistance to bending, compression, tension or torsion in particular orientations). In some embodiments, outer periphery component 100 can serve as a structural member to which other electronic device components can be mounted. Some of the structural integrity of outer periphery component 100 can come from the closed shape that it defines (e.g., outer periphery component 100 forms a loop, thus providing structural integrity).

Outer periphery component 100 can have any suitably shaped cross-section. For example, outer periphery component 100 can have a substantially rectangular cross-section. Each corner of the substantially rectangular cross-section can be rounded in shape, thus forming a "spline." As used herein, the term "spline" refers to a rounded corner portion of an outer periphery component. In some embodiments, outer periphery component 100 can have a cross-section in any other suitable shape including, for example, a circular shape, an oval shape, a polygonal shape, or a curved shape. In some embodiments, the shape or size of the cross-section of outer periphery component 100 can vary along the length or width of the electronic device (e.g., an hourglass shaped cross-section).

Outer periphery component 100 of the electronic device can be constructed using any suitable process. In some embodiments, outer periphery component 100 can be constructed by connecting section 110 and section 120 together at interface 112, connecting section 120 and section 130 together at interface 122, connecting section 130 and section 140 together at interface 132, and connecting section 140 and section 110 together at interface 142. Although outer periphery component 100 is illustrated in FIG. 1 as being constructed from four sections, one skilled in the art could appreciate that outer periphery component 100 could alternatively be formed from any suitable number of two or more sections, and that the interfaces between the sections may be positioned at any location on outer periphery component 100.

Each section 110, 120, 130, and 140 can be constructed individually and later assembled to form outer periphery component 100. For example, each section can be individually constructed using one or more of stamping, machining, working, casting, or any combinations of these. In some embodiments, the materials selected for sections 110, 120, 130, and 140 can be conductive, thus allowing the sections to provide an electrical functionality for the electronic device. For example, sections 110, 120, 130 and/or 140 can be formed from a conductive material such as stainless steel or aluminum. In some embodiments, each section may serve as an antenna for the electronic device.

To mechanically couple individual sections together, knuckles 114, 124, 134, and 144 can exist at interfaces 112, 122, 132, and 142 respectively. In some embodiments, each of the knuckles can be constructed from a material that can begin in a first state and may subsequently change to a second state. As an illustration, the knuckles can be constructed from a plastic that begins in a first, liquid state and then subsequently changes to a second, solid state. While in the liquid state, the plastic can be allowed to flow into interfaces 112, 122, 132, and 142. After flowing into these interfaces, the plastic material may subsequently be allowed to harden into knuckles 114, 124, 134, and 144 (e.g., the plastic material is allowed to change into the second, solid state). Upon changing into the solid state, the plastic material may then bond together sections 110 and 120, 120 and 130, and 140 and 110, respectively, thus forming a single new component (e.g., outer periphery component 100). In one embodiment, knuckle 134 may be cosmetic and not physically couple sections 130 and 140 together. In this embodiment, sections 130 and 140 can be welded together so that they are physically and electrically coupled. In another embodiment, knuckle 134 may physically couple sections 130 and 140 together in accordance with principles of the invention.

Knuckles 114, 124, and 144 not only physically couple together sections 110 and 120, 120 and 130, and 140 and 110, respectively, they electrically isolate section 110 from section 120, section 120 from section 130, and section 140 from section 110. For purposes of this discussion, assume sections 130 and 140 are electrically the same because they are welded together, and that knuckle 134 is cosmetic. As will be explained in more detail below, knuckles 114, 124, and 144 encapsulate and/or exist with coupling structures that are attached to or integrally formed parts of sections 110, 120, 130, and 140. That is, when the knuckle in its first state (e.g., the liquid state), it flows into and/or around the coupling structures. A shutoff device (not shown) may be positioned at each interface to shape the knuckle for when it transforms into its second state (e.g., the solid state). As shown in FIG. 1, knuckles 114 and 124 are asymmetric in shape and knuckle 144 is symmetric in shape.

The coupling structures (not shown) exist on sections 110, 120, 130, and 140. Some sections (e.g., sections 110 and 120) may have two coupling structures whereas other sections (e.g., sections 130 and 140) have one coupling structure for interfacing with a knuckle. In some embodiments, the coupling structure can be a bracket such as that shown, for example, in FIG. 2. The bracket can be attached or welded to an inside surface of a section. In another embodiment, the coupling structure can be an integrally formed part of the section that was originally part of the section. In FIG.

1, knuckle 114 interfaces with a bracket and an integrally formed coupling structure and knuckles 124 and 144 interface with two brackets.

Any suitable process can be used to place the knuckle material into interfaces 112, 122, 132, and 142, and any suitable process can be used to change the knuckle material from the first state to the second state. In some embodiments, a "molding process" can be used in which the knuckle material is initially inserted in a liquid state and then is subsequently hardened. For example, one or more of injection molding, compression molding, transfer molding, extrusion molding, blow molding, thermoforming, vacuum forming, or rotomolding processes can be used. In this case, a "one shot" process can be used in which the knuckle material is inserted in a single step, and then independently changes to its second state. In other words, the knuckle can be formed in a single step (e.g., in "one shot") without necessitating additional steps or manufacturing processes.

The knuckle material may be any material suitable for mechanically coupling two sections together and electrically isolate the two section. The knuckle material may be a plastic such as a thermal plastic. In one embodiment, the knuckle material may be a glass filled nylon.

FIGS. 2A-G show several views of an illustrative bracket 200 in accordance with an embodiment of the invention that can be mounted to one of the sections. In particular, FIGS. 2A-G show back, top, front, left, right, bottom, and isometric views respectively of bracket 200. Bracket 200 can include three legs 210, 220, and 230, which extend from planer member 240. Legs 210 and 220 may both extend away from planer member 240 at a right angle (e.g., 90 degrees), whereas leg 230 may extend away from leg 230 at angle between 1 and 90 degrees. Leg 230 can have slot 232 to promote flow of knuckle material when it is in its first state. In addition, plate 240 can have through-hole 242 or a cutout of any suitable shape to promote flow of knuckle material when in its first state. Legs 210, 220, and 230 may have feet 214, 224, and 234, respectively, for being welded to a surface of one of the sections.

Bracket 200 can be constructed from any suitable material. In some embodiments, bracket 200 is constructed from a conductive material such as metal (e.g., steel or aluminum). In some embodiments, bracket 200 is constructed from the same material as the section it is being welded to. For example, bracket 200 and the section it is being welded to can both be constructed from stainless steel.

It is understood that brackets of any suitable construction can be used in connection with the sections. For example, FIGS. 2H-2N shows several views of bracket 250 constructed in accordance with an embodiment of the invention. Bracket 250 is similar in many respects to bracket 200 as it includes legs and welding feet, as well as a cutout for promoting knuckle material flow. However, bracket 250 may be dimensioned slightly smaller than bracket 200, for example, to better fit in a curved portion of a section.

Figure 3A:
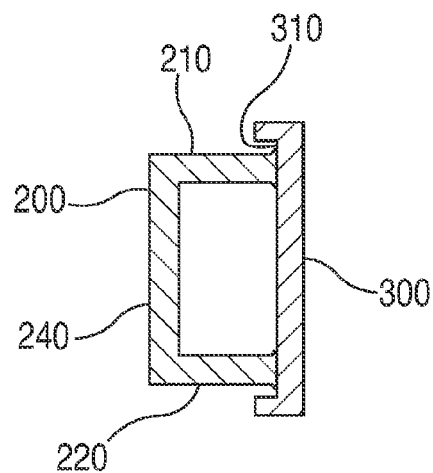
FIGS. 3A and 3B show illustrative views of a bracket welded to a section in accordance with some embodiments of the invention.
Figure 3B:
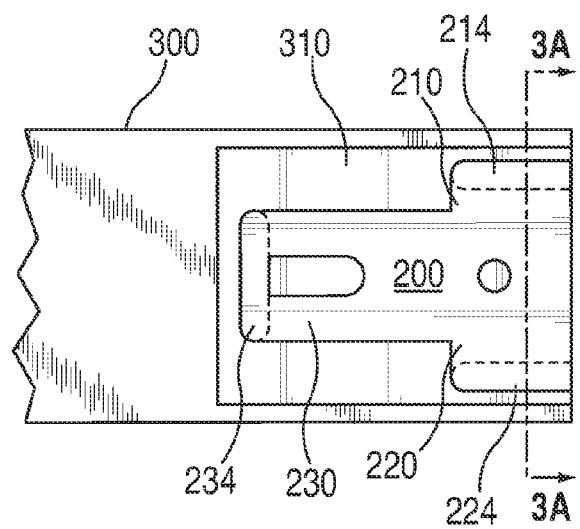

Referring now to FIGS. 3A and 3B, illustrative views of bracket 200 welded to section 300 are shown. In particular, FIG. 3A shows an illustrative cross-sectional view and FIG. 3B shows an illustrative top view. Bracket 200 is shown sitting within recess 310 of section 300. Recess 310 may have been machined out of section 300 during or after manufacture of section 300. Recess 310 may serve as a vessel for retaining a portion of a knuckle as it transitions from its first to second state. As shown, feet 214, 224, and 234 are welded to recess 310. This weld physically anchors bracket 200 to section 300 and electrically couples bracket to section 300.

Figure 4:
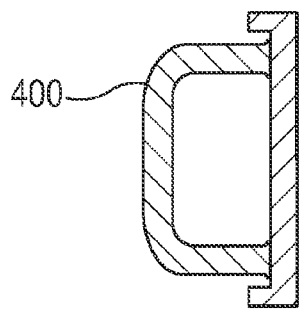
FIG. 4 shows an illustrative view of another bracket welded to a section in accordance with some embodiments of the invention.

The edge of bracket 200 aligns with the edge of section 300. This alignment may be a product of a cutting operation that physically cuts away a portion of bracket 200 and section 300. It is the total cross-sectional area of the aligned edges of bracket 200 and section 300 that control capacitance of the knuckle coupling two sections together. Smaller cross-sections generally result in less capacitance. In embodiments where the section is used as an antenna, lower capacitance enhances antenna performance. The cross-sectional area can be varied, for example, by increasing the thickness of bracket 200 or using a bracket that has a different cross-sectional shape. See FIG. 4 as an example of another bracket 400 having a different cross-sectional shape.

Figure 5B:
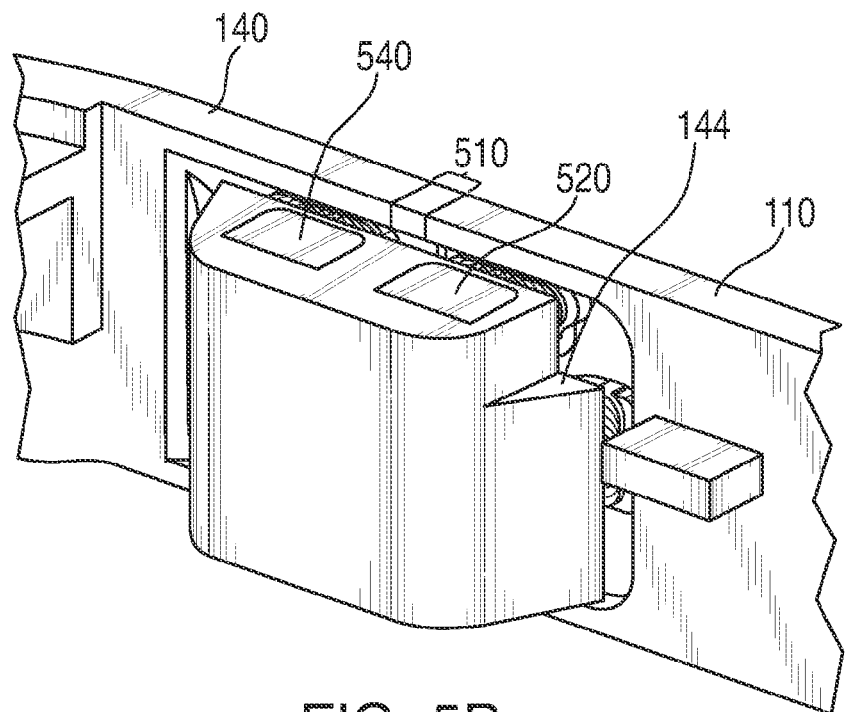
FIGS. 5A and 5B show various views of a particular knuckle design in accordance with one embodiment of the invention.
Figure 5A:
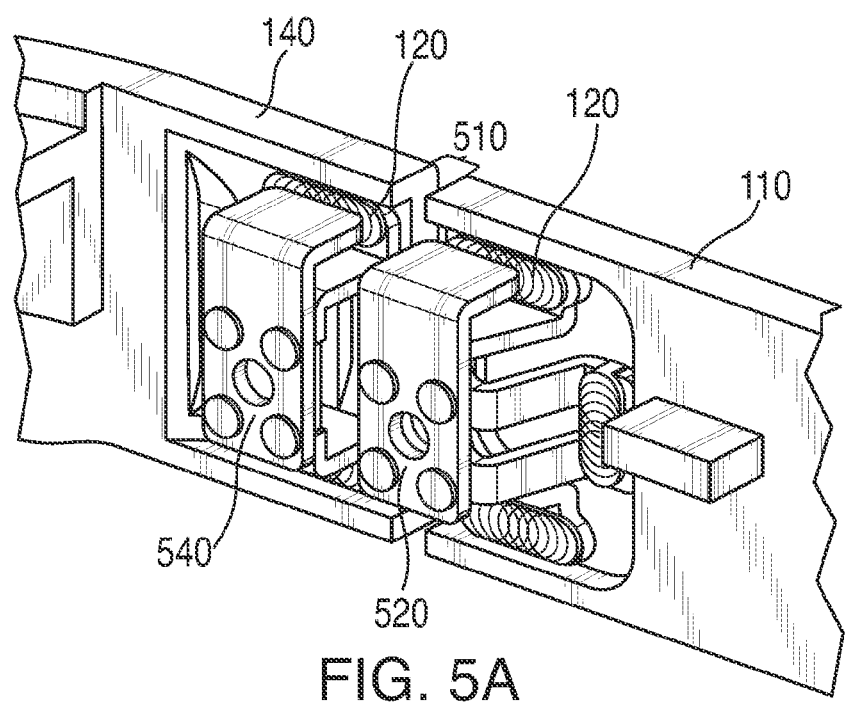

FIG. 5A shows an illustrative enlarged perspective view of sections 110 and 140 (of FIG. 1) having respective brackets 200 welded thereto in accordance with an embodiment of the invention. FIG. 5A also shows contact members 520 and 540 welded to top of the planer member of each bracket 200. Contact members 520 and 540 have a cutout that mimics cutout 242 of bracket 200 and that promotes flow of knuckle material when it is in its first state. A portion of contact members 520 and 540 will be left exposed after the knuckle material encapsulates brackets 200 and members 520 and 540. The exposed portion may provide a solder pad for connecting a conductor (e.g., an antenna conductor) so that it is electrically coupled to one of sections 120 or 140.

Gap 510 exists between the side walls of sections 110 and 140. Gap 510 may have a predetermined distance that is maintained between the side walls and brackets 200 during application of the knuckle material. When the material is applied, it can flow in and around brackets 200, members 520 and 540, and fill the recesses in which brackets 200 sit. After the material cures, resulting knuckle 144 (FIG. 5B) is provided.

FIG. 5B shows a perspective view of knuckle 144 in accordance with an embodiment of the invention. As shown, knuckle 144 physically couples sections 100 and 140 together but ensures they are electrically isolated by the distance of gap 510. Portions of contact members 520 and 540 are exposed even though knuckle 144 is cured. It is understood that contact members 520 and 540 are optional and are not necessary for each knuckle. For example, knuckle 124 may not encapsulate any contact members.

Figure 6A:
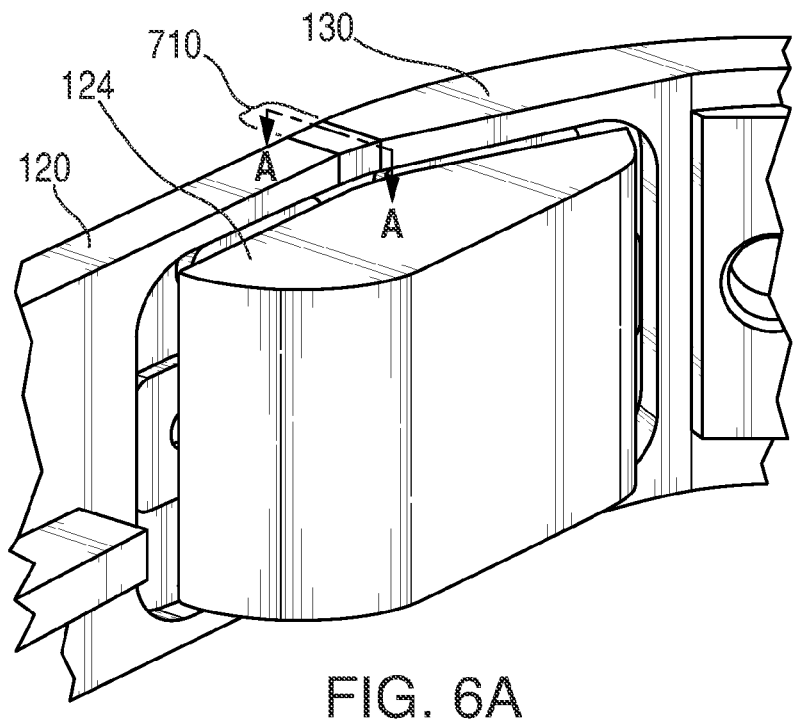
FIGS. 6A-6C show various schematic views of another particular knuckle design in accordance with one embodiment of the invention.
Figure 6B:
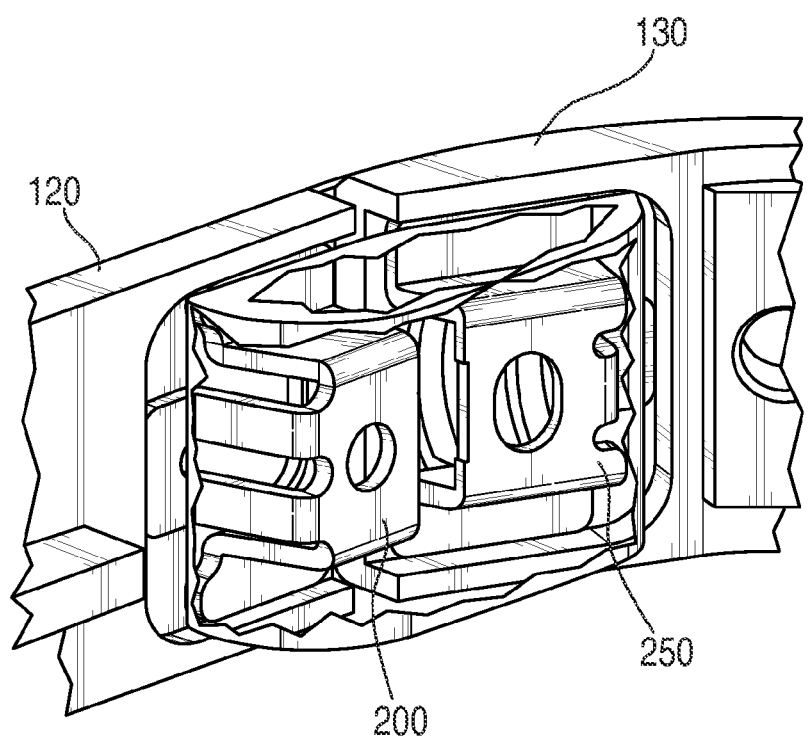
Figure 6C:
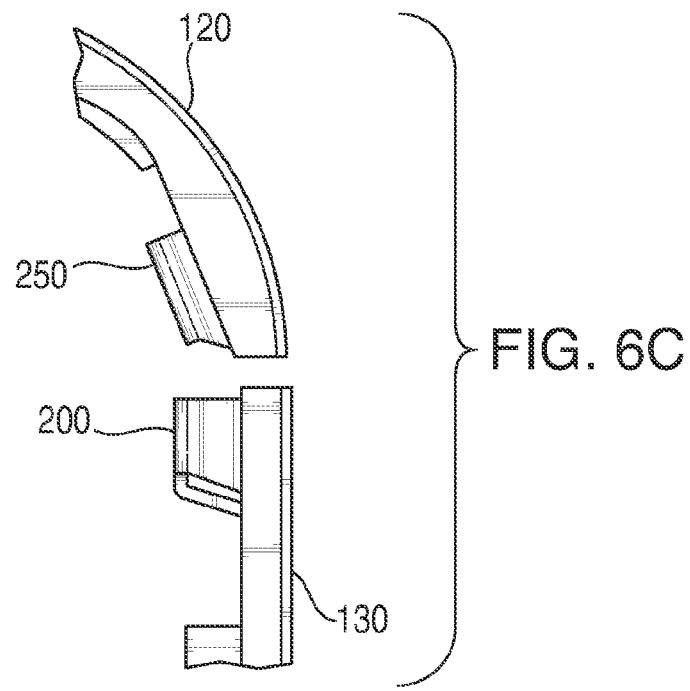

FIG. 6A shows a perspective view of knuckle 124 of FIG. 1 in accordance with an embodiment of the invention. Knuckle 124 can encapsulate two brackets (not shown) and mechanically couple sections 120 and 130 together, and ensures they are electrically isolated by gap 710. FIGS. 6B and 6C show a perspective view and a top view, respectively, of brackets 200 and 250 mounted to sections 120 and 130, respectively. Bracket 250 is dimensioned a little smaller than its counterpart bracket 200 and thus may be better suited for being mounted in curved sections, such as section 120.

Figure 7:
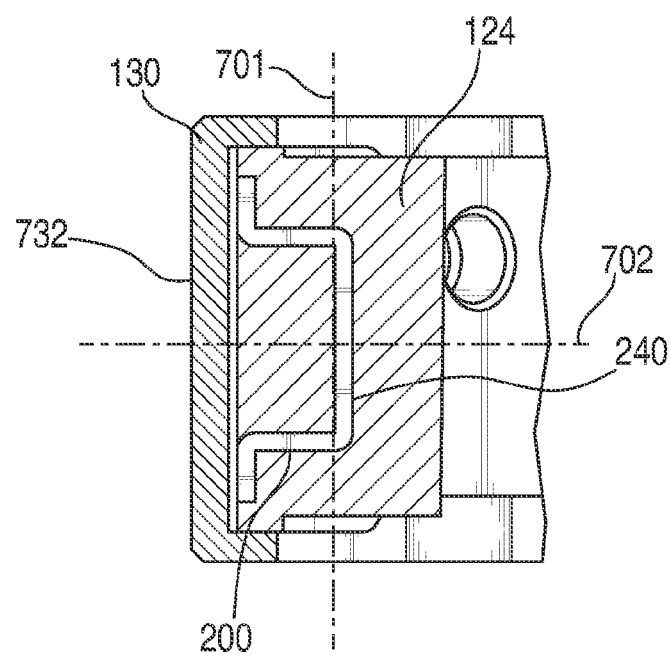
FIG. 7 shows a cross-sectional view of the knuckle of FIG. 6A in accordance with one embodiment of the invention.

FIG. 7 shows a cross-sectional view taken along line A-A of FIG. 6A. The cross-sectional view shows side wall 732 of section 130, knuckle 124, and bracket 200. Also shown is vertical center axis 701 which is aligned with plate member 240. Horizontal center axis 702 is also shown to bisect plate member 240. Equal thicknesses of knuckle 124 exist on both sides of center axes 701 and 702. This ensures knuckle 124 is even distributed about the bracket and provides optimal mechanical coupling strength.

Figure 8A:
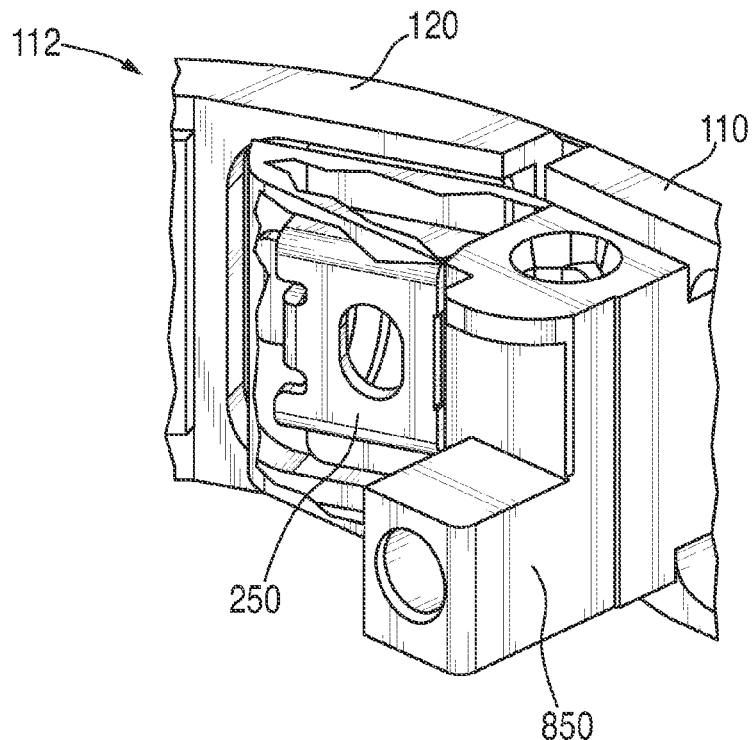
FIGS. 8A-8C show various schematic views of yet another particular knuckle design in accordance with one embodiment of the invention.
Figure 8B:
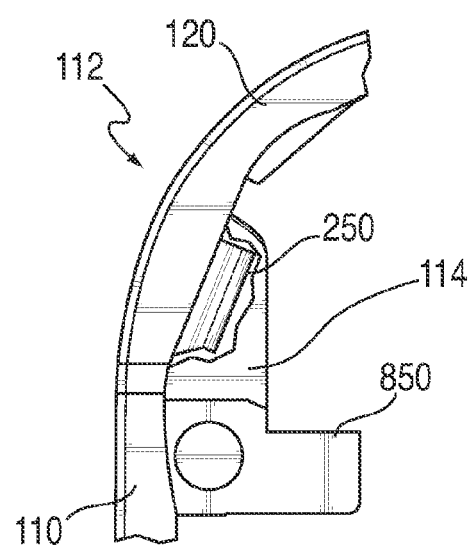
Figure 8C:
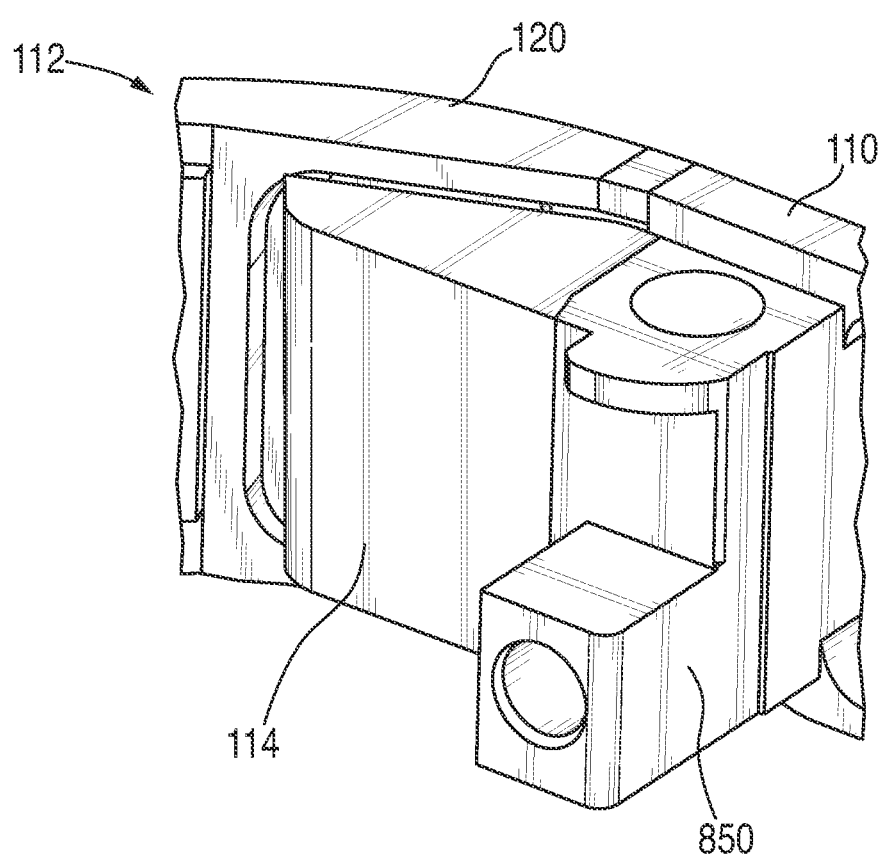

FIGS. 8A-C show various illustrative views of interface 112 in accordance with embodiments of the invention. FIG. 8A shows bracket 250 mounted to section 120 and it also shows integrated coupling structure 850. FIGS. 8B and 8C show knuckle 114 interfacing with bracket 250 and coupling structure 850.

Figure 9:
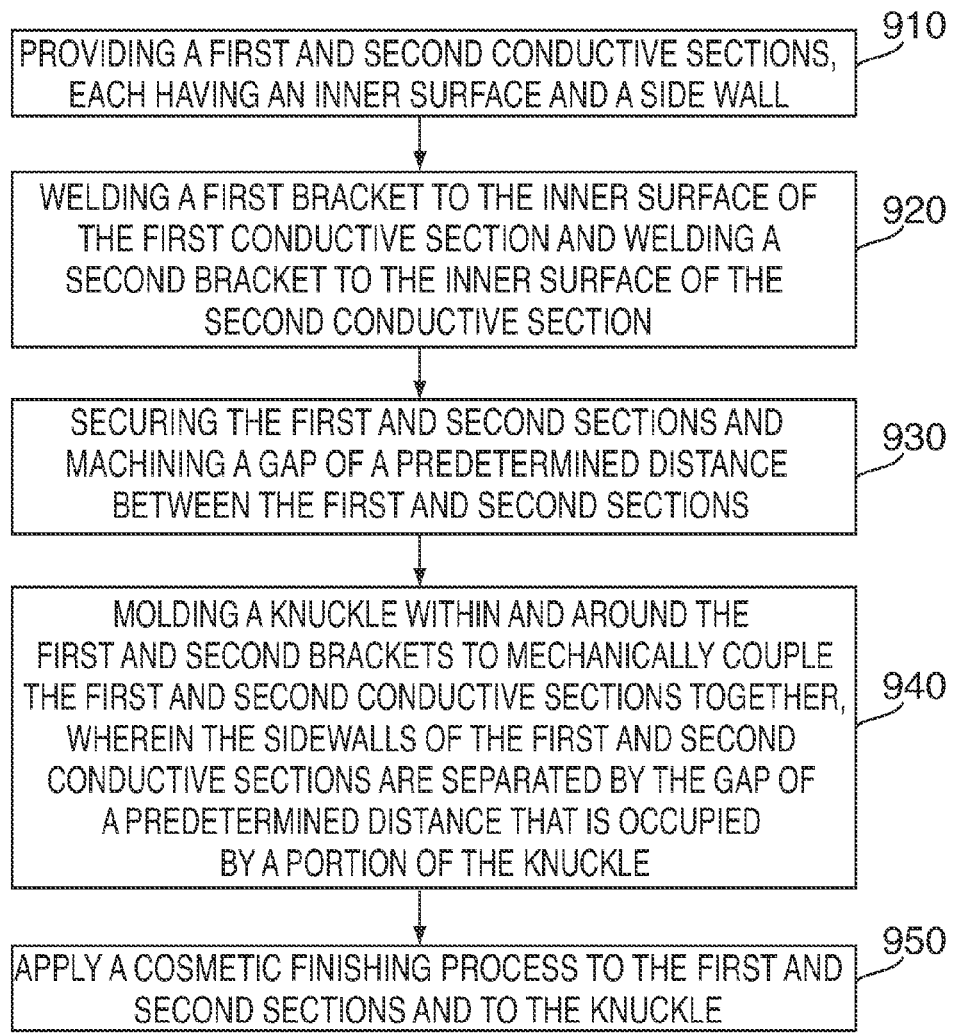
FIG. 9 shows an illustrative process for mechanically coupling two sections together in accordance with some embodiments of the invention.

FIG. 9 shows an illustrative process for mechanically coupling two conductive sections together in accordance with an embodiment of the invention. Beginning at step 910 first and second conductive sections are provided. The conductive sections each have an inner surface and a side wall. For example, the conductive sections can be sections 110 and 120 of FIG. 1. The sections are discrete components that have been previously machined or manufactured. If desired, a recess can be machined out of a portion of each section, and in particular a portion of the inner surface.

At step 920, a first bracket is welded to the inner surface of the first conductive section and a second bracket welded to the inner surface of the second conductive section. The brackets can be seen in FIG. 2, for example. The welds physically and electrically couple the brackets to their respective sections. In some embodiments, the brackets can be welded within a recess of the section. In other embodiments, contact members (e.g., as shown in FIG. 5) may be welded to the brackets.

At step 930, the first and second sections are secured in place and a gap of a predetermined distance is machined between the two sections. The machining precisely cuts away a portion of each section and a portion of the brackets, and in some embodiments, may cut away a portion of the contact member if present. The resulting gap is maintained because the sections are secured.

At step 940, a knuckle is molded within and around the first and second brackets to mechanically couple the first and second conductive sections together, wherein the sidewalls of the first and second conductive sections are separated by the gap of a predetermined distance that is occupied by a portion of the knuckle. During molding of the knuckle, a shutoff device may be applied to the sections to shape and control the flow of knuckle material. The knuckle material surrounds the bracket (and optional contact member) and fills in the recess when in its molten or liquid state.

At step 950, a cosmetic finishing process is applied to the sections and knuckle. This process can involve trimming away a portion of the knuckle and polishing the sections to meet a desired aesthetic appeal.

It should be understood that the processes described above are merely illustrative. Any of the steps may be removed, modified, or combined, and any additional steps may be added or steps may be performed in different orders, without departing from the scope of the invention.

The described embodiments of the invention are presented for the purpose of illustration and not of limitation.

What is claimed is:

1. An electronic device, comprising:
a first conductive section having a first inner surface;
a first coupling structure extending from the first inner surface;
a second conductive section having a second inner surface;
a second coupling structure extending from the second inner surface;
a contact member coupled to the first coupling structure;
an antenna circuit electrically connected to the first conductive section via the contact member; and
an insulating interface formed around the first and second coupling structures such that the first and second conductive sections are structurally coupled together and the first coupling structure is encapsulated by the insulating interface, the first conductive section, and the contact member.

2. The electronic device of claim 1, wherein the first and second coupling structures are conductive.

3. The electronic device of claim 1, wherein the contact member comprises a solder pad.

4. The electronic device of claim 1, wherein the insulating interface electrically isolates the first conductive section from the second conductive section.

5. The electronic device of claim 1, wherein the first and second coupling structures have different dimensions.

6. An electronic device, comprising:
a first conductive section having a first inner surface and a first protrusion formed thereon, the first conductive section electrically coupled to antenna circuitry;
a second conductive section having a second inner surface and a second protrusion formed thereon; and
an insulating coupling section formed around the first and second protrusions such that the first and second conductive sections are coupled together and the first protrusion is surrounded in a plane by the insulating coupling section and the first conductive section.

7. The electronic device of claim 6, wherein the first and second conductive sections are coupled together to define a gap between the first and second conductive sections.

8. The electronic device of claim 7, wherein a portion of the insulating coupling section fills the gap.

9. The electronic device of claim 6, wherein the first conductive section and the first protrusion are formed of a same material.

10. The electronic device of claim 6, wherein a portion of the insulating coupling section fills a portion of the first protrusion.

11. The electronic device of claim 6, further comprising a third protrusion formed on the first inner surface.

12. The electronic device of claim 6, wherein the first conductive section varies in thickness across a length of the first conductive section.

13. An electronic device, comprising:
a first conductive segment having a first inner surface and a first coupling structure protruding therefrom, the first conductive segment is operable as an antenna;
a second conductive segment having a second inner surface and a second coupling structure protruding therefrom; and
an insulating intermediate segment molded around the first and second coupling structures such that the first and second conductive segments are joined together and the first coupling structure is encapsulated by the insulating intermediate segment.

14. The electronic device of claim 13, wherein the first coupling structure is integrally formed with the first conductive segment.

15. The electronic device of claim 13, wherein the second coupling structure is encapsulated by the insulating intermediate segment and the second inner surface.

16. The electronic device of claim 13, wherein the first conductive segment has a first edge, the first coupling structure has a second edge, and the first edge is aligned with the second edge.

17. The electronic device of claim 16, wherein a cross-sectional area of the first edge and the second edge is configured to control a capacitance of the insulating intermediate segment.

18. The electronic device of claim 16, wherein the second conductive segment has a third edge that is parallel to the first edge.

19. An electronic device, comprising:
a first conductive section having a first inner surface and a first protrusion formed thereon;
a second conductive section having a second inner surface and a second protrusion formed thereon;
a third protrusion formed on the first inner surface; and
an insulating coupling section formed around the first and second protrusions such that the first and second conductive sections are coupled together;
wherein, across a plane intersecting the insulating coupling section and the first conductive section, the first protrusion is surrounded by the insulating coupling section and the first conductive section.

20. The electronic device of claim 19, further comprising:
a third conductive section; and
an additional insulating coupling section that couples the third conductive section to the first conductive section.

21. The electronic device of claim 19, wherein the additional insulating coupling section at least partially envelops the third protrusion.

\* \* \* \* \*